United States Patent [19]
Vidrine et al.

[11] 4,284,949
[45] Aug. 18, 1981

[54] NUCLEAR MAGNETIC RESONANCE SPECTROMETER AND METHOD

[75] Inventors: Drouet W. Vidrine, Madison, Wis.; Paul E. Peterson, Columbia, S.C.

[73] Assignee: Nicolet Instrument Corporation, Madison, Wis.

[21] Appl. No.: 13,627

[22] Filed: Feb. 21, 1979

[51] Int. Cl.³ ............................................. G01N 27/00
[52] U.S. Cl. .................................................. 324/315
[58] Field of Search ......................... 324/315, 307, 312

[56] References Cited

PUBLICATIONS

A. Ohte, "A Precision NOR Thermometer", IEEE Transactions on Inst. and Measurement, vol. IM-25, No. 4, pp. 357-362, Dec. 1976.
D. B. Utton, "Thermometry of NQR", Inst. Tech., vol. 23, No. 12, pp. 47-52, Dec. 1976.

Primary Examiner—Michael J. Tokar
Attorney, Agent, or Firm—Schroeder, Siegfried, Ryan, Vidas, Steffey & Arrett

[57] ABSTRACT

A nuclear magnetic resonance technique that allows simultaneous temperature determination and spectral acquisition. The technique employs a modification of the lock circuit of a Varian XL-100 Spectrometer which permits accurate measurement of the difference in resonance frequency between a primary lock nucleus and another, secondary, nucleus. The field stabilization function of the main lock circuit is not compromised. A feedback signal having a frequency equal to the frequency difference is substituted for the normal power supply in the spectrometer's existing radio frequency transmitter to modulate that transmitter. Thus, the transmitter's radio frequency signal is enhanced in a frequency corresponding to the resonance peak of the secondary nucleus. Determination of the frequency difference allows the determination of temperature without interference with the observed spectrum. The feedback character of the circuit and the presence of noise make the circuit self-activating.

12 Claims, 3 Drawing Figures

NUCLEAR MAGNETIC RESONANCE SPECTROMETER AND METHOD

BACKGROUND OF PRIOR ART

Temperature measurement in nuclear magnetic resonance has traditionally been accomplished by thermocouple replacement or by the measurement of a temperature-dependent frequency difference between two nuclear resonances. If the two nuclei being used for thermometric measurement are the same isotope as the nuclei being observed, they appear superimposed on the observed spectrum unless measurement is accomplished by tube replacement. This superimposition often obscures the observed spectrum, especially in the narrow shift range of $^1H$ nuclei. Alternately observing one isotope and then another for temperature determinations solves this problem. However, most nuclear magnetic resonance (NMR) spectrometers are capable of observing only one isotope at a time. Thus, temperature determination simultaneous to spectral acquisition is ordinarily still not possible.

BRIEF SUMMARY OF THE INVENTION

The present invention employs heteronuclear lock to permit simultaneous temperature determination and spectral acquisition without interference with the observed spectrum. It has been implemented as a modification of the Varian XL-100 lock circuit to permit accurate measurement of a frequency difference between a primary and secondary lock nucleus, without compromising the field stabilization function of the main lock circuit. A signal having a frequency equal to the frequency difference between the resonant peak centers of the primary and secondary lock nuclei is used to modulate the existing transmitter radio frequency output. The resulting transmitter radio frequency output has a center frequency that continues to excite the primary lock nucleus while one of the side bands has the correct frequency to excite the secondary lock nucleus. That is, the modulation results in a transmitter output enriched in a frequency corresponding to the resonance peak of the secondary nucleus.

The present invention was implemented with the designated spectrometer used in the normal, "frequency swept" mode, to provide $^{19}F$ lock and $^1H$ observe capability. The spectrometer used 41 KHz field modulation and single-side band synchronous detection. The resonant signals of the two lock nuclei were detected as an audio signal of which the fundamental frequency is equal to the frequency difference between the magnetic resonances of the primary and secondary nuclei. This audio signal is filtered to remove harmonics and noise and amplified to produce the modulation signal. The circuit elements, both existing and added, act as a feedback oscillator with the main frequency-selective element in the feedback loop being the frequency difference between the resonance peaks of the two nuclei. The feedback loop character of the circuit and the presence of noise make the circuit self-activating and insure an output which is the frequency difference between the two peak maxima, exact to better than 0.10 of the peak widths.

DETAILED DESCRIPTION OF INVENTION

Figure 1:
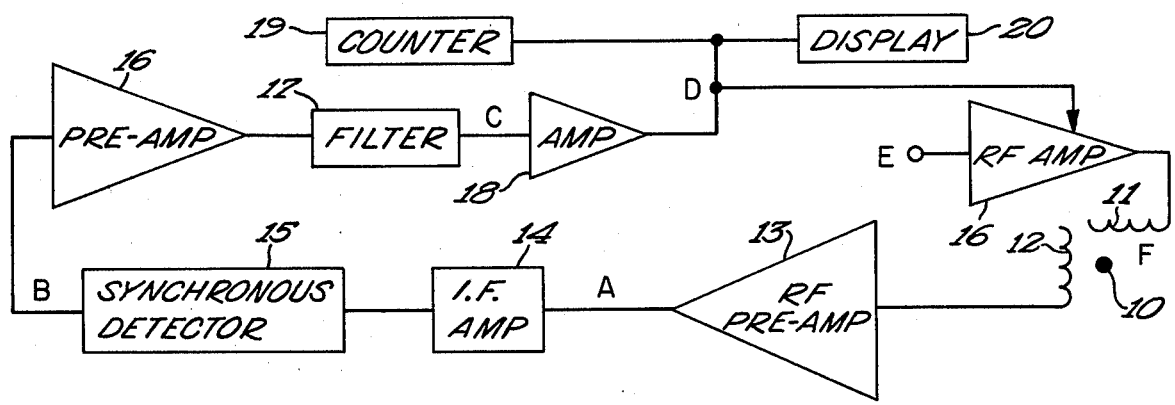
FIG. 1 is a diagrammatic illustration of an implementation of the present invention.

FIG. 1 diagrammtically illustrates the modifications made to the lock circuit of a Varian XL-100 spectrometer to implement the present invention and establish a heteronuclear lock technique whereby temperature determination may be made simultaneous to ordinary spectral acquisition. In the technique of the present invention, the spectrometer is used in the normal, "frequency swept" mode, to provide $^{19}F$ lock and $^1H$ observe capability. Single-side band synchronous detection and 41 KHz field modulation were used.

Element 10 in FIG. 1 represents the probe of the designated Varian spectrometer while elements 11 and 12 represent the transmitter and receiving coils of that spectrometer, respectively. Radio frequency preamplifier 13, intermediate frequency amplifier stages 14 and synchronous detector 15 are present within the lock circuit of the designated spectrometer and are unaltered in the implementaion of the present invention. Radio frequency amplifier 16 is also present in the lock circuit of the designated spectrometer but is altered to provide a modulated output signal in a manner to be described more fully below. Other elements of the spectrometer are not illustrated for the sake of clarity.

As is known in the prior art, when resonance is produced within the probe 10 the resonance signal is detected by the detector coil and fed to the input of the amplifier 13. The output of the preamplifier 13 (point A) is fed through intermediate frequency amplifier stages 14 to a synchronous detector 15 having an output (point B). In the present invention, the resonant signals of two lock nuclei (point A) are detected as an audio signal (point B) of which the fundamental frequency is equal to the frequency difference between the two resonances. In the implementation of the present invention, the signal at point B is fed to a preamplifier 16 and filtered by a filter 17 to remove most harmonics and noise to result in signal at point C. The signal at point C is then amplified by an amplifier 18 to result in a modulating signal at point D which is applied to the radio frequency amplifier 16 in a manner to be described more fully below.

The signal at point D is equal to the frequency difference between the primary and secondary lock nucelei. That frequency difference can be determined by a counter 19 to allow a temperature determination and/or be observed on an appropriate display device 20 which may be an oscilloscope, recorder, or other similar device. Thus, the present invention allows a determination of the difference in resonance frequency of two nuclei thereby allowing simultaneous temperature determination and spectral acquisition. The feedback loop character of the circuit and the presence of noise make the circuit self activating and insure an output at point D which is the frequency difference between the two peak maxima. Modulation of the amplifier 16 enriches its output in a frequency corresponding to the resonance peak of the secondary nucleus to provide a self-sustaining resonance of the secondary nucleus.

The lock modulation circuit illustrated in FIG. 1 was assembled largely from modular equipment. As noted above, elements 10–16 are contained within the lock circuit of a Varian XL-100 NMR spectrometer. Channel 1 of a Tektronix 454 oscilloscope formed preamplifier 16 while channel 2 of that oscilloscope was used as display 20 to observe the audio frequencies at point D. A Krohn-Hite 3700 active filter was used in the "max flat" position as filter 17 for audio noise and overtone rejection. To filter an audio frequency of approximately 420 Hz, for example, the filter was set to give a constance gain of +20 dB between 300 and 600 Hz, while attenuating frequencies outside that band by 24 dB/octave, to a maximum attenuation of 80 dB below band pass gain. Frequency measurements (counter 19) were made by period-average counting on a Hewlett-Packard 5245L electronic counter with a time-base calibrated to an accuracy plus or minus 50 parts per billion versus National Bureau of Standards (1958) tables of microwave transition frequency. Thermocouple measurements discussed below were made using a copper-constantan junction calibrated to plus or minus 0.02 degrees C. using a National Bureau of Standards-certified plantinum resistance thermometer. Regulated voltages were each supplied by Zener diodes acting through emitter-follower outputs.

Figure 2:
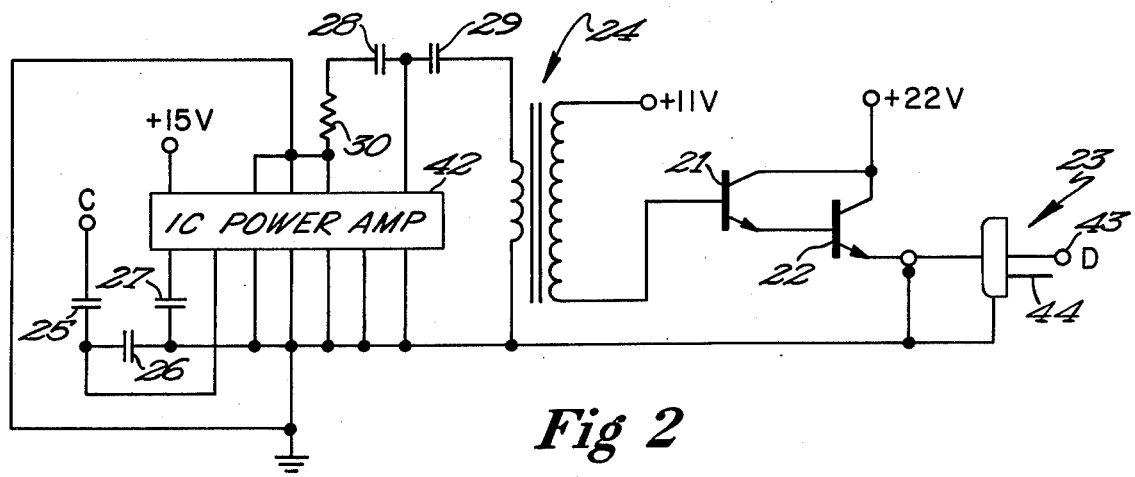
FIG. 2 illustrates a portion of the embodiment of FIG. 1.

FIG. 2 illustrates the design of an audio amplifier having a Darlington emitter-follower output which supplies audio modulation power that was employed as amplifier 18 in FIG. 1. The circuit of FIG. 2 is of conventional design and will not be discussed in detail except with regard to its interaction with the modification of the radio frequency oscillator 16 of the designated Varian spectrometer. Power amplifier 42 is an ordinary 2.5 W integrated circuit power amplifier designated by National Semi-Conductors, Inc. as SL 60745 that is thermally connected to 60 cm² of copper heat sink fins. Transistors 21 and 22 are of the type designated as 2N697 and DTS 430, respectively. Element 23 is a conventional output jack which will be described more fully below, the output jack being point D in FIG. 1. The input to the circuit is a signal appearing at point C. The values of the remaining circuit elements of FIG. 2 are as follows:

| Capacitors | Microfarads |
|---|---|
| 25 | 1.0 |
| 26 | 0.001 |
| 27 | 5.0 |
| 28 | 0.1 |
| 29 | 500.0 |

| Resistor | Ohms |
|---|---|
| 30 | 2.7 |

Figure 3:
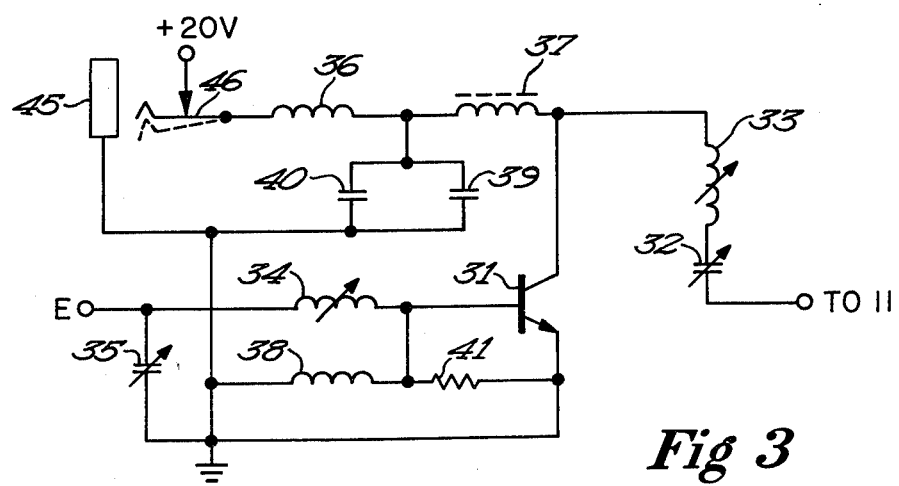
FIG. 3 illustrates a modification to the radio frequency amplifier of the Varian XL-100 spectrometer employed in the implementation illustrated in FIG. 1.

FIG. 3 illustrates the radio frequency amplifier 16 of the designated Varian spectrometer modified only at its input in a manner to be described below. Transistor 31 is of the type designated 2N3553 while circuit elements 32-35 are variable circuit elements. The remaining circuit elements have the following values:

| Inductors | Microhenries |
|---|---|
| 36 | 1.0 |
| 37 | 0.39 |
| 38 | 1.0 |

| Capacitors | Microfarads |
|---|---|
| 39 | 1.0 |
| 40 | 0.0001 |

| Resistor | Ohms |
|---|---|
| 41 | 100.0 |

Again with reference to FIG. 2, jack 23 is provided with two output terminals 43 and 44 of conventional design. The amplifier of FIG. 3 is normally connected to a 20 volt power supply. In the implementation of the present invention, this amplifier was modified to allow a substitution of the signal at point D for the power supply to provide a modulation of the output of the amplifier. This is accomplished by the addition of a receptable including a contact member 45 and a movable contact member 46. Member 46 is normally in contact with a terminal connected to the 20 volt power supply allowing the circuit of FIG. 3 to operate in its intended manner. However, on insertion of the jack 23 into the receptacle including contacts 45 and 46, terminal 44 will make electrical contact with element 45 while terminal 43 of jack 23 will engage member 46 causing it to deflect to the position illustrated in phantom in FIG. 3. Thus connected, the circuitry of FIG. 3 will be out of electrical communicaton with the 20 volt power supply with the signals appearing at point D of FIG. 1 (at the output terminals of the jack 23) being substituted therefor to modulate the amplifier output. Input signals at point E are at the resonance frequency of the primary lock nucleus, in known manner.

Operation of the lock modulation circuit of FIG. 1, constructed as set forth above, was investigated using a lock mixture of 2:1, v:v (CBrF)$_2$:(CCl$_2$F)$_2$. The spectrometer was locked in the normal manner on the largest peak (CBrF$_2$ CBrF$_2$). Then the circuit, with a preamplifier 16 gain of −3 to +6 dB, was connected as illustrated in FIG. 1. Modulation commenced spontaneously, growing to a maximum (clipping) level in 2-5 seconds, depending on the exact gain. The frequency of the audio sine wave output was determined to be 401.20 Hz by period-average counting for 10,000 cycles (approximately 25 seconds), using the counter time base. The measured frequency varied less than 0.01 Hz over ten minutes of successive counts. For a frequency difference of 401 Hz and a primary lock frequency of 94.184509 MHz, the frequencies present at the points designated A-F in FIG. 1 are as follows:

Point A: 94184509, 94184910
Point B: 401, 802, 1203, 1604, etc, noise, DC bias.
Point C: 401
Point D: 401, (CV AC) 11 V DC bias
Point E: 94184509
Point F: 49184108, 94184509, 94184910

With the same lock mixture, the frequency difference between the two nuclei was measured by letting a 12 mm tube containing that mixture, with thermocouple immersed, equilibrate for ½ hr., after first connecting the modulation circuit and adjusting the gain with the thermocouple. After equilibration, the thermocouple was removed whereupon spinning commences spontaneously, and the spectrometer was manually locked to one of the $^{19}$F resonances. Modulation occurred spontaneously in a few seconds. The audio frequency of the modulation circuit was measured to determined the frequency difference between the two nuclear resonances. The frequency difference was found to be 429.341 Hz at 0.15 degrees C. and 420.058 Hz at 11.63 degrees C. The temperatures were established with the thermocouple. From these results, a linear approximation was interpolated in which the frequency difference is equal to 429.459−(0.8083×T degrees C.). Using this approximation, a temperature jump experiment was conducted in which the temperature was equilibrated at 0.8 degrees C. after which the setting of the Varian temperature controller was increased 10 degrees C. Frequency difference were measured and converted to temperature and were found to be in agreement with non-spinning thermocouple measurements.

Many modifications and variations of the present invention are possible in light of the above teachings. For example, the preamplifier 16, filter 17 and the amplifier 18, together with an associated power supply, may be consolidated on a single chassis. An automatic gain control circuit may also be provided in the preamplifier 16. Also, band pass frequency adjustments may be eliminated while improving filtering through the use of a phase-lock loop active filter. A latch-and-hold circuit, possibly as a part of a phase-lock loop, may be employed to permit use with pulse lock. Additionally, frequency-voltage conversion of the signal appearing at point D may allow the circuit output to be used as a sensor for a probe thermoregulator. It should be noted that the present invention differs from nuclear side-band oscillation in that the feedback is the frequency difference between two spectrum peaks. Also, while it resembles stochastic noise excitation NMR, which uses continuous noise for excitation and also produces a continuous time-domain spectrum, the system of the present invention uses a feedback signal which is enriched in the resonance frequency to excite the secondary lock nucleus. It is therefore to be understood, that the invention may be practiced otherwise than as specifically described.

We claim:

1. In a nuclear magnetic resonance spectrometer of the type having transmitting means for exciting a first nucleus in a sample in a polarizing magnetic field at a frequency corresponding to its resonant peak, the improvement which comprises feedback means including means for detecting the frequency difference between the resonant peak of said first nucleus and the resonant peak of a second nucleus in said sample and means for modulating said transmitting means with a signal representative of said frequency difference.

2. The spectrometer of claim 1 further comprising means for determining said frequency difference.

3. In a nuclear magnetic resonance spectrometer of the type having means for transmitting a radio frequency signal to excite a first nucleus in a sample in a polarizing magnetic field at a frequency corresponding to its resonance peak, the improvement which comprises feedback means including means for detecting the frequency corresponding to the resonance peak of a second nucleus in the sample and means providing a modulation signal to said transmitting means for enriching said radio frequency signal in a frequency corresponding to the resonance peak of said second nucleus.

4. The spectrometer of claim 3 wherein said feedback means comprises means for detecting the frequency difference between said first and second nuclei resonance peaks.

5. The spectrometer of claim 4 wherein said modulation signal consists essentially of a signal having a frequency equal to said frequency difference and noise.

6. The spectrometer of claim 5 further comprising means for determining said frequency difference.

7. In a nuclear magnetic resonance spectrometer of the type having means for applying a radio frequency magnetic field to a sample in a polarizing magnetic field at the resonance frequency of a first nucleus within said sample, the improvement which comprises feedback means including means for detecting the resonance frequency of a second nucleus in said sample and for modulating said radio frequency magnetic field to provide a radio frequency magnetic field having a center frequency equal to said first nucleus resonance frequency and one of its sidebands equal to the detected resonance frequency of said second nucleus.

8. The spectrometer of claim 7 wherein said feedback means comprises means for detecting the frequency difference between said first and second nuclei resonance peaks.

9. The spectrometer of claim 8 further comprising means for determining said frequency difference.

10. The spectrometer of claim 8 wherein said feedback means provides a modulation signal consisting essentially of a signal having a frequency equal to said frequency difference and noise.

11. The method of determining the nuclear resonance frequency difference between first and second nuclei in a sample within a polarizing magnetic field comprising the steps of:
   locking a radio frequency transmitter on the resonance frequency of one of said first and second nuclei;
   detecting the frequency difference between said one resonance frequency and the resonance frequency of the other sample nucleus;
   modulating said radio frequency transmitter with a feedback signal representative of the detected frequency difference; and
   determining said frequency difference.

12. The method of claim 11 wherein the step of modulating comprises the step of modulating with a feedback signal that includes noise.

* * * * *

UNITED STATES PATENT AND TRADEMARK OFFICE
CERTIFICATE OF CORRECTION

PATENT NO. : 4,284,949

DATED : August 18, 1981

INVENTOR(S) : Drouet W. Vidrine and Paul E. Peterson

It is certified that error appears in the above-identified patent and that said Letters Patent are hereby corrected as shown below:

Column 3, lines 8-9, "constance" should be --constant--.

Column 4, line 27, "communicaton" should be --communication--.

Column 4, line 62, "commences" should be --commenced--.

Column 4, line 66, "determined" should be --determine--.

Column 5, line 5, "429.459" should be --429.458--.

Signed and Sealed this

Nineteenth Day of January 1982

[SEAL]

Attest:

Attesting Officer

GERALD J. MOSSINGHOFF

Commissioner of Patents and Trademarks